United States Patent
Li

(10) Patent No.: US 7,910,684 B2
(45) Date of Patent: *Mar. 22, 2011

(54) DIKETOPYRROLOPYRROLE-BASED DERIVATIVES FOR THIN FILM TRANSISTORS

(75) Inventor: Yuning Li, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 709 days.

This patent is subject to a terminal disclaimer.

(21) Appl. No.: 11/850,915

(22) Filed: Sep. 6, 2007

(65) Prior Publication Data

US 2009/0065878 A1 Mar. 12, 2009

(51) Int. Cl.
*C08G 14/06* (2006.01)
(52) U.S. Cl. ........ 528/163; 528/216; 528/117; 528/377; 528/380; 257/66; 257/40
(58) Field of Classification Search .................. 528/163, 528/216, 117, 54, 94, 377, 380; 257/40
See application file for complete search history.

(56) References Cited

U.S. PATENT DOCUMENTS

| 4,415,685 | A | 11/1983 | Iqbal et al. | |
|---|---|---|---|---|
| 4,579,949 | A | 4/1986 | Rochat et al. | |
| 6,107,117 | A | 8/2000 | Bao et al. | |
| 6,451,459 | B1 | 9/2002 | Tieke et al. | |
| 7,170,093 | B2 | 1/2007 | Wu et al. | |
| 2002/0060321 | A1* | 5/2002 | Kazlas et al. | 257/66 |
| 2005/0057136 | A1 | 3/2005 | Moriya et al. | |
| 2007/0112171 | A1 | 5/2007 | Li et al. | |
| 2007/0148812 | A1 | 6/2007 | Wu et al. | |
| 2007/0160847 | A1 | 7/2007 | Ong et al. | |

FOREIGN PATENT DOCUMENTS

| EP | 1510535 A1 | 7/2004 |
|---|---|---|
| WO | WO 2005/049695 A1 | 6/2005 |
| WO | WO 2008/000664 A1 | 1/2008 |

OTHER PUBLICATIONS

U.S. Appl. No. 11/850,965, filed Sep. 6, 2007, Li.

(Continued)

*Primary Examiner* — Randy Gulakowski
*Assistant Examiner* — Shane Fang
(74) *Attorney, Agent, or Firm* — Fay Sharpe LLP

(57) ABSTRACT

A thin film transistor device includes a semiconductor layer. The semiconductor layer includes a compound comprising a chemical structure represented by:

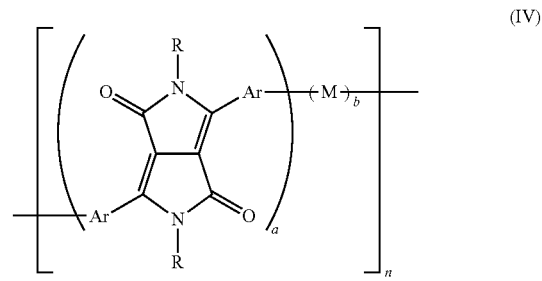

(IV)

wherein each R is independently selected from hydrogen, an optionally substituted hydrocarbon, and a hetero-containing group,
each Ar is independently selected from optionally substituted aryl and heteroaryl groups,
each M is an optional, conjugated moiety,
a represents a number that is at least 1,
b represents a number from 0 to 20, and
n represents a number that is at least 1.

7 Claims, 2 Drawing Sheets

OTHER PUBLICATIONS

D.Cao, et al., Synthesis and Characterization of Novel Red-Emitting Alternating Copolymers Based on Fluorene and Diketopyrrolopyrrole Derivatives, *Journal of Polymer Science Part A: Polymer Chemistry*, vol. 44, No. 8, pp. 2395-2405, 2006.

T.Beyerlein, et al., New Photoluminescent Conjugated Polymers with 1,4-dioxo-3,6-diphenylpyrrolo[3,4-c]pyrrole (DDP) and 1,4-phenylene Units in the Main Chain, *Macromol. Rapid Commun.*, vol. 21, No. 4, pp. 182-189, 2000.

C.D.Dimitrakopoulos, et al., Organic Thin Film Transistors for Large Area Electronics, *Adv.Mater.*, vol. 14, No. 2, pp. 99-117, 2002.

I.McCulloch, et al., Liquid-Crystalline Semiconducting Polymers with High Charge-Carrier Mobility, *Nat. Mater.*, 5, 328, (2006).

Y.Li, et al., Poly(2,5-bis(2-thienyl)-3,6-dialkylthieno[3.2-b]thiophene)s—High-Mobility Semiconductors for Thin-Film Transistors, *Adv. Mater.*, 18, 3029-3032, (2006).

* cited by examiner

DIKETOPYRROLOPYRROLE-BASED DERIVATIVES FOR THIN FILM TRANSISTORS

CROSS REFERENCE TO RELATED PATENTS AND APPLICATIONS

The following copending application, the disclosure of which is incorporated herein in its entirety by reference, is mentioned:

Application Ser. No. 11/850,965, filed Sep. 6, 2007, entitled DIKETOPYRROLOPYRROLE-BASED POLYMERS, by Yuning Li.

BACKGROUND

The exemplary embodiment relates to diketopyrrolopyrrole (DPP)-derivatives, such as small molecules, oligomers, and semiconducting polymers based thereon. These molecules find application in semiconductor layers of electronic devices such as organic thin film transistors (OTFTs).

Thin film transistors (TFTs) are basic components of many electronic devices, including sensors, image scanners, and electronic display devices. OTFTs offer advantages over conventional, silicon-based materials in that manufacturing costs can be reduced as well as providing mechanical properties such as the devices being physically compact, lightweight, and flexible. OTFTs are generally composed of a supporting substrate, three electrically conductive electrodes (gate, source and drain electrodes), a channel semiconductor layer, and an electrically insulating gate dielectric layer separating the gate electrode from the source and drain electrodes. The channel semiconductor is in turn in contact with the source and drain electrodes. The materials used to make the OTFTs, and the interfacial properties between various layers of semiconductor, dielectric, and electrodes can all affect the performance of the OTFTs.

Thiophene-based fused-ring small molecules and polymers are high mobility p-type semiconductors which have been used for thin film transistors. However, due to the relatively high HOMO (highest occupied molecular orbital) energy level of these materials, most of them are sensitive to oxygen and therefore not suitable for fabrication of devices under ambient conditions.

For example, thieno[3,2-b]thiophene-based polymers have shown high field effect mobility of 0.2-0.6 cm2/Vs (See, e.g., McCulloch, I., et al. *Nat. Mater.* 5, 328 (2006)). However these polymers have shown some sensitivity towards oxygen and moisture in air, thus hampering their solution fabrication of TFTs in ambient conditions.

There is a need for methods which will improve air stability of the semiconductor layer while providing high charge carrier mobility.

INCORPORATION BY REFERENCE

U.S. Pub. No. 20070112171, entitled POLYMER HAVING THIENO[3,2-B] THIOPHENE MOIETIES, by Yuning Li, et al., discloses a polymer comprising one or more types of repeat units, wherein the polymer comprises a substituted thieno[3,2-b]thiophene component A and a different component B in the same type of repeat unit or in different types of repeat units.

U.S. Pub. No. 20070160847, entitled ORGANIC THIN-FILM TRANSISTORS, by Beng. S. Ong, et al. discloses a semiconductor layer for an OTFT comprising an organic p-type semiconducting polymer. In particular, the semiconducting polymer is a crystalline conjugated polyarylamine.

U.S. Pub. No. 20070148812, entitled ORGANIC THIN-FILM TRANSISTORS, by Yiliang Wu, et al., discloses a method for making an organic thin-film transistor having an acid-doped semiconducting layer with enhanced charge carrier mobility. The methods includes polymerizing a monomer to form a semiconducting polymer, doping the semiconducting polymer with an acid to form an acid-doped semiconducting polymer, and depositing the acid-doped semiconducting polymer onto a component of an organic thin-film transistor to form an organic thin-film transistor having an acid-doped semiconducting layer.

BRIEF DESCRIPTION

In accordance with one aspect of the exemplary embodiment, a thin film transistor device including a semiconductor layer is provided. The semiconductor layer includes a compound having the chemical structure:

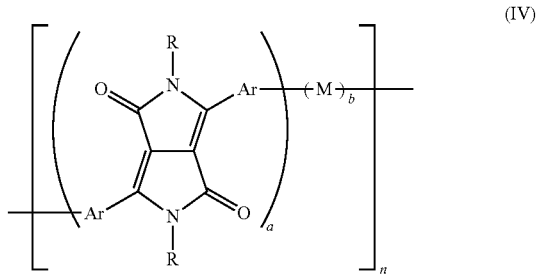

(IV)

wherein each R is independently selected from hydrogen, an optionally substituted hydrocarbon, and a hetero-containing group, each Ar is independently selected from optionally substituted aryl and heteroaryl groups, each M is an optional, conjugated moiety, a represents a number that is at least 1, b represents a number from 0 to 20, and n represents a number that is at least 1.

In accordance with another aspect of the exemplary embodiment, a thin film transistor device is provided. The device includes a semiconductor layer comprising a pyrrolo [3,4-c]pyrrole-1,4-dione moiety.

In accordance with another aspect of the exemplary embodiment, a method of forming a thin film transistor includes a) polymerizing a monomer and optionally a comonomer to form a polymer, the monomer being represented by the general structure:

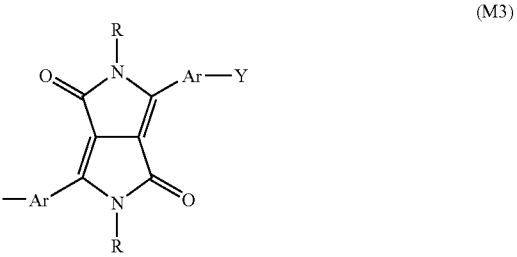

(M3)

wherein each Y is a halogen, each R is independently selected from hydrogen, an optionally substituted hydrocarbon, and a hetero-containing group.

each Ar is independently selected from optionally substituted aryl and heteroaryl groups,
each M is an optional conjugated moiety,
a represents a number that is at least 1,
b is 0 in the case of the homopolymer and represents a number from 1 to 20 in the case of the copolymer, and
n represents a number that is at least 1; and
(b) forming a semiconducting layer of a thin transistor of a polymeric material comprising the polymer.

DETAILED DESCRIPTION

Aspects of the exemplary embodiment disclosed herein relate to compounds (small molecules, oligomers, and polymers) based on diketopyrrolopyrrole (DPP) (i.e., pyrrolo[3,4-c]pyrrole-1,4-dione), polymeric materials based on such compounds, and to methods for the use of DPP as a building block for forming such polymeric materials. Such materials are suitable for use as semiconductors, particularly for OTFTs. The highly conjugated DPP-based compounds provide a p-type semiconductor material which has advantages over conventional semiconductor materials. In particular, the electron-withdrawing nature of DPP, due to the diketone units, improves the air-stability and its highly conjugated, fused ring structure enhances the field-effect mobility of the semiconductor materials disclosed herein.

In various aspects, specific molecules and polymers, disclosed herein, comprise a DPP derivative having an ([Ar-D-A]$_a$-M$_b$)$_n$ structure, where D represents a highly conjugated, electron-withdrawing, fused ring structure comprising an optionally N,N-substituted pyrrolo[3,4-c]pyrrole-1,4-dione moiety, Ar represents an optionally substituted aryl or heteroaryl group, M represents an optional, conjugated moiety different from Ar-D-A, and a and b represent the number of each of the components shown, where a is at least 1, b can be 0 or from 1 to about 20, and n represents the number of repeat units, and can be, for example, from 1-5000. In the case of a polymer, the polymer may be for example a homopolymer or a copolymer, wherein, for each type of repeat unit, the number of repeat units may be from for example 2 to about 5000, particularly from about 10 to about 2000. In specific embodiments, Ar represents an optionally substituted heteroaryl group comprising a five-membered heterocycle, such as thiophene, furan, or pyrrole.

Without being bound by any particular theory, the electron-withdrawing nature of this structure, due to the diketone units, is provided with improved air-stability and enhanced field-effect mobility by the substituted five-membered heterocycle. The five-membered heterocycles, such as thiophene, furan, and pyrrole, in these polymers are electron-rich and thus facilitate hole injection and transport in the TFT devices. In addition, the five-membered heterocycles result a lesser steric hindering effect than larger aromatic rings, such as phenylene-based moeities. This is considered to minimize the twisting of the polymer backbone, leading to high coplanarity of the backbone. Coplanarity of the backbone assists in achieving high electron mobility, in particular, by maintaining sp$^2$ orbitals in alignment, along which the positively charged holes travel.

Figure 1:
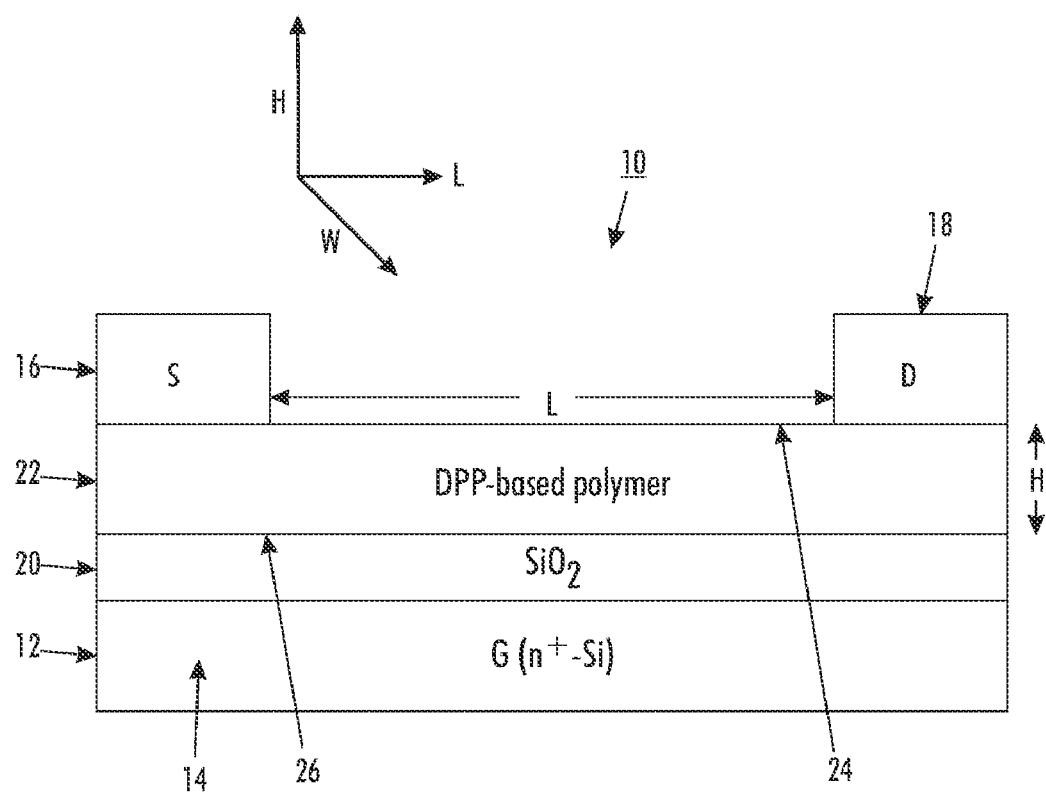
FIG. 1 is a cross sectional view of an exemplary embodiment of an OTFT having a semiconductor layer in accordance with the exemplary embodiment.

FIG. 1 illustrates an exemplary configuration of an OTFT 10 which may be formulated with the exemplary DPP-based compounds. The OTFT 10 comprises a substrate 12, gate, source, and drain electrodes 14, 16, and 18, respectively, a dielectric layer 20, and a semiconductor layer 22, which may be formed in accordance with exemplary embodiments disclosed herein. Substrate 12 comprises or is in contact with gate electrode 14. Although in the illustrated embodiment, the gate electrode 14 is depicted as being wholly within the substrate 12 (the entire substrate serves as the gate electrode in this embodiment), this is not required; the key is that the dielectric layer 20 separates the gate electrode 14 from the source electrode 16, drain electrode 18, and the semiconductor layer 22. In other embodiments, gate electrode 14 may be formed as a channel in substrate 12, e.g., by doping a portion of the substrate, or may be formed as a surface layer on the substrate 12.

The illustrated semiconductor layer 22 has opposed first and second planar surfaces 24, 26. The source electrode 16 contacts the semiconductor layer 22. The drain electrode 18 also contacts the same surface 24 of the semiconductor layer 22. The semiconductor layer 22 runs over the dielectric layer 20 and extends between the source and drain electrodes 16 and 18. The OTFT device includes a semiconductor channel with a width W and length L (perpendicular to the page in FIG. 1).

Other configurations of an OTFT in which the exemplary semiconductor layer 22 may be employed are disclosed, for example, in above-mentioned U.S. Pub. Nos. 20070112171 and 20070160847, the disclosures of which are incorporated herein in their entireties, by reference.

In one embodiment, where the substrate 12 also serves as the gate electrode 14, the substrate may be formed e.g., of a heavily n-doped silicon wafer. In other embodiments, the substrate 12 may be composed of silicon, glass plate, plastic film or sheet or other suitable substrate material. For structurally flexible devices, a plastic substrate, such as for example polyester, polycarbonate, polyimide sheets and the like may be employed. The thickness of the substrate 12 may be from about 10 micrometers to over 10 millimeters with a representative thickness being from about 50 to about 100 micrometers, especially for a flexible plastic substrate and from about 1 to about 10 millimeters for a rigid substrate, such as glass plate or silicon wafer.

The semiconductor layer 22 has a thickness H ranging for example from about 10 nanometers to about 1 micrometer, e.g., from about 20 to about 200 nanometers. The semiconductor channel width W may be, for example, from about 1 micrometers to about 5 millimeters, with a specific channel width being about 5 micrometers to about 1 millimeter. The semiconductor channel length L may be, for example, from about 1 micrometer to about 1 millimeter with a more specific channel length being from about 5 micrometers to about 100 micrometers.

The gate, source, drain and electrodes 14, 16, 18 can be made of any suitable electrically conductive materials. The gate electrode 14 can be, for example, a thin metal film, a conducting polymer film, a conducting film made from conducting ink or paste or the substrate itself, for example heavily doped silicon. Examples of gate electrode materials include but are not restricted to aluminum, gold, silver, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode layer can be prepared by vacuum evaporation, sputtering of metals or conductive metal oxides, coating from conducting polymer solutions or conducting inks by spin coating, casting or printing, or doping of the substrate. The illustrated gate electrode 14 is formed from n-doped silicon. The thickness of the gate electrode layer ranges for example from about 10 to about 200 nanometers for metal films and in the range of about 1 to about 10 micrometers for polymer conductors.

Typical materials suitable for use as source and drain electrodes 16, 18 include those of the gate electrode materials such as gold, nickel, aluminum, platinum, conducting polymers and conducting inks. In the illustrated embodiment, the source and drain electrodes 16, 18 are formed from an electrically conductive material, such as gold.

Typical thicknesses of source and drain electrodes are about, for example, from about 40 nanometers to about 1 micrometer with the more specific thickness being about 100 to about 400 nanometers.

The dielectric layer 20 generally can be an inorganic material film or an organic polymer film. Illustrative examples of inorganic materials suitable as the gate dielectric layer include silicon oxide, silicon nitride, aluminum oxide, barium titanate, barium zirconium titanate and the like; illustrative examples of organic polymers for the gate dielectric layer include polyesters, polycarbonates, poly(vinyl phenol), polyimides, polystyrene, poly(methacrylate)s, poly(acrylate)s, epoxy resin and the like. In the exemplary embodiment, a thermally grown silicon oxide ($SiO_2$) may be used as the dielectric layer 20.

The thickness of the dielectric layer 20 is, for example from about 10 nanometers to about 2000 nanometers depending on the dielectric constant of the dielectric material used. A representative thickness of the dielectric layer is from about 100 nanometers to about 500 nanometers. The dielectric layer may have a conductivity that is for example less than about $10^{-12}$ S/cm.

In various embodiments, the gate dielectric layer, the gate electrode, the semiconductor layer, the source electrode, and the drain electrode are formed in any sequence with the gate electrode and the semiconductor layer both contacting the dielectric layer, and the source electrode and the drain electrode both contacting the semiconductor layer. The phrase "in any sequence" includes sequential and simultaneous formation. For example, the source electrode and the drain electrode can be formed simultaneously or sequentially. The composition, fabrication, and operation of field effect transistors are described, for example, in U.S. Pat. No. 6,107,117 to Bao et al., the disclosure of which is totally incorporated herein by reference.

For a p-channel OTFT, the source electrode is grounded and a bias voltage of generally, for example, about 0 volt to about −80 volts is applied to the drain electrode to collect the charge carriers transported across the semiconductor channel when a voltage of generally about +20 volts to about −80 volts is applied to the gate electrode.

In some embodiments, the semiconductor layer 22 incorporating the present polymer in an OTFT device generally exhibits a field-effect mobility of greater than for example about $10^{-3}$ $cm^2$/Vs (square centimeter per Volt per second), and an on/off ratio of greater than for example about $10^3$. On/off ratio refers to the ratio of the source-drain current when the transistor is on to the source-drain current when the transistor is off. In some embodiments, the field-effect mobility is greater than about $10^{-2}$ $cm^2$/Vs and in some embodiments, is greater than about $5 \times 10^{-2}$ $cm^2$/Vs, e.g., 0.08-0.12 $cm^2$/Vs. In some embodiments, the on/off ratio is at least $10^4$ and in some embodiments, 105 or higher, e.g., about $10^6$.

While the exemplary embodiment is described herein in terms of a semiconductor layer for organic thin film transistors, it is to be appreciated that the polymeric materials disclosed herein may find application in forming semiconductors for other electronic devices.

The exemplary semiconductor layer 22 comprises a compound (molecule, oligomer, or polymer) comprising a pyrrolo[3,4-c]pyrrole-1,4-dione moiety (DPP moiety or unit):

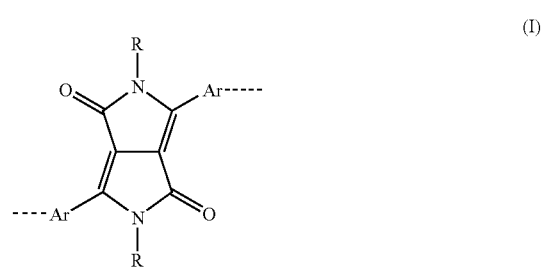

(I)

Where each R is independently selected from: hydrogen, a hydrocarbon, such as alkyl or aryl, and a hetero-containing group, such as heteroaryl. The DPP moiety is substituted with two Ar groups, where each Ar is independently aryl or heteroaryl and where each Ar may be a terminal group or not a terminal group. Unless otherwise noted, all alkyl, aryl, and heteroaryl groups disclosed herein may be substituted or unsubstituted.

Generic structures of monomers, oligomers, and polymers containing the pyrrolo[3,4-c]pyrrole-1,4-dione moiety of structure (I), which are suitable for use in semiconductors for OTFTs, are shown in structures (II), (III), and (IV) below:

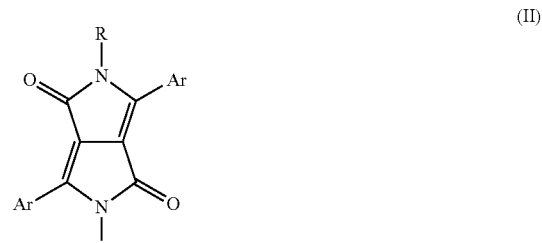

(II)

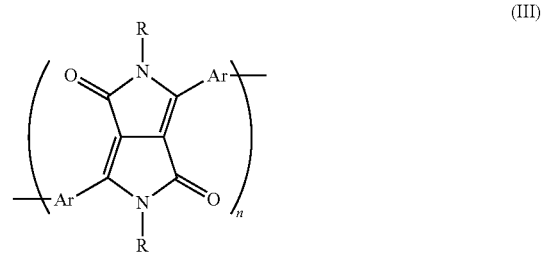

(III)

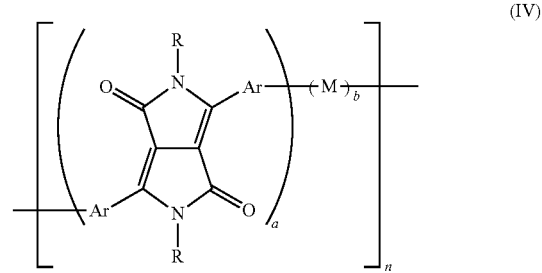

(IV)

wherein:

each R is independently selected from: hydrogen, an optionally substituted hydrocarbon, such as alkyl or aryl, and a hetero-containing group, such as heteroaryl;

each Ar is independently selected from: optionally substituted aryl and heteroaryl;

each M is a conjugated moiety and may be independently selected from representative groups as shown below;

a represents the number of DPP units, and can be at least 1, e.g., from 1 to 20;

b represents the number of the conjugated moiety M, and can be from zero to 20, e.g., 1-20;

n represents the number of repeat units and is at least 1. In the case of a polymer as represented in III and IV, n can be at least 2, e.g., from 2 to 5000, such as, from 10-50; and wherein each repeat unit can be the same moiety or a different moiety. For a semiconductor polymer, a regular or substantially regular repeat unit is generally more advantageous for high charge mobility.

As will be appreciated, structure (IV) is representative of all three structures, since a and n can independently be 1 and b can be 0.

Exemplary conjugated moieties M include, but are not limited to the following:

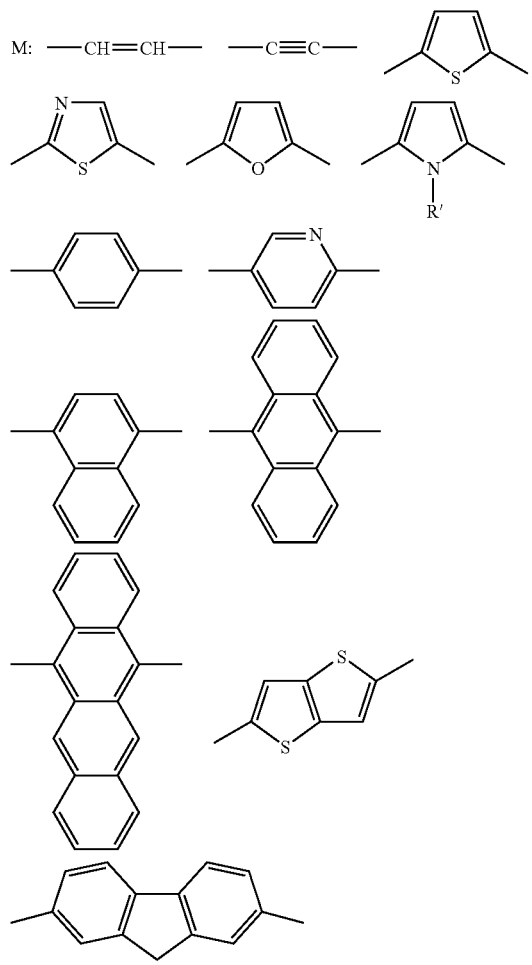

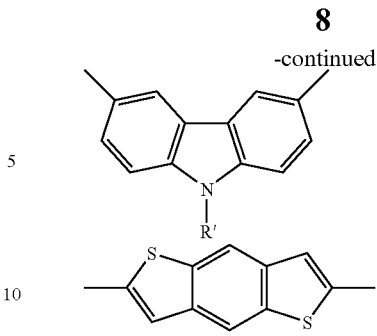

-continued wherein each R' is independently selected from: hydrogen, a hydrocarbon such as alkyl or aryl, a hetero-containing group such as heteroaryl or alkoxy, and halogen. Any of the above exemplary conjugated moieties M can be substituted, for example, by replacement of one or more of the hydrogens with an alkyl, aryl, alkylaryl, halogen, or hydroxyl group, combination thereof, or the like.

For the R groups of structures (I), (II), (III) and (IV), exemplary hydrocarbons may include any suitable optionally substituted hydrocarbon group. The optionally substituted hydrocarbon group contains for example from 1 to about 50 carbon atoms, or from 4 to about 20 carbon atoms, and may be selected from, for example, a straight chain alkyl group, a branched alkyl group, a cycloalkyl group, an aryl group, an alkylaryl group, and an arylalkyl group.

Exemplary alkyl groups suitable for R include, but are not limited to methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, cyclopentyl, cyclohexyl, cycloheptyl, and isomers thereof. The alkyl group is optionally substituted one or more times with, for example, a halogen (chlorine, bromine, fluorine, and iodine) or a heteroatom-containing group as described herein, or a mixture thereof.

Exemplary aryl groups are aromatic hydrocarbon groups (including alkoxyaryl and alkylaryl groups) having 6 to 500 carbon atoms, which are suitable for R include, but are not limited to phenyl, polyphenyl, and naphthyl; alkoxyphenyl groups, such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl, other aryl groups listed as exemplary M groups, and combinations thereof.

Exemplary heteroatom-containing groups suitable for R or as substituents for alkyl groups used as R may include any suitable heteroatom and may include, but are not limited to, a nitrogen containing moiety, an alkoxy group, a heterocyclic system, an alkoxyaryl, and an arylalkoxy. Representative heteroatom-containing groups include for example cyano, nitro, methoxyl, ethoxyl, and propoxyl as the heteroatom. The heteroatom containing group has for example 2 to about 120 atoms, or from 2 to about 80 atoms.

For R', exemplary hydrocarbons and hetero-containing groups include those listed for R above. In the case of R' being halogen, any suitable halogen can be used (chlorine, bromine, fluorine, or iodine).

For Ar in structures (I), (II), (III), and (IV), exemplary aryl groups include those aryl groups suggested for R.

In various aspects, the Ar group is an optionally substituted heteroaryl group. Heteroaryl groups are heterocycles which include an unsaturated ring comprising at least two carbon atoms (generally, at least four carbon atoms) and at least one atom which is a different atom from carbon (a heteroatom, such as S, Se, O, or N). The heteroaryl group may have, for example, 5 to about 120 atoms, or from 10 to about 80 atoms. In one embodiment, the heteroaryl group is an electron-donating group, which assists in the hole transport. In the case of S, Se, O, or N (which may be an NR" group), in particular, each of these exemplary heteroatoms includes a lone electron pair, which helps the hole transport. Exemplary heteroaryl groups include those heteroaryl groups suggested for R.

In one embodiment, Ar is an optionally substituted heteroaryl group which includes one or more repeat units of a five-membered ring, such as thiophene, furan, or pyrrole.

Other heteroaryl groups are also contemplated for Ar, such as oxazole, isoxazole, pyridine, thiazole, isothiazole, imidazole, triazole, pyrazole, furazan, thiadiazole, oxadiazole, pyridazine, pyrimidine, pyrazine, indole, isoindole, indazole, chromene, quinoline, isoquinoline, cinnoline, quinazoline, quinoxaline, naphthylidine, phthalazine, purine, pteridine, thienofuran, imidazothiazole, benzofuran, benzothiophene, benzoxazole, benzthiazole, benzthiadiazole, benzimidazole, imidazopyridine, pyrrolopyridine, pyrrolopyrimidine, pyridopyrimidine, and combinations thereof.

In specific embodiments, the heteroaryl group includes a five-membered unsaturated ring comprising a single heteroatom, such as S, Se, O, or N in the form of NR", where R" is as defined for R in structures (I)-(IV) above, and is bonded to the respective fused ring of the DPP moiety by this five-membered unsaturated ring.

Structure (V) illustrates an exemplary compound according to structure (IV) in which Ar comprises an optionally substituted five-membered heterocycle, that is suited to use in the exemplary semiconductor layer:

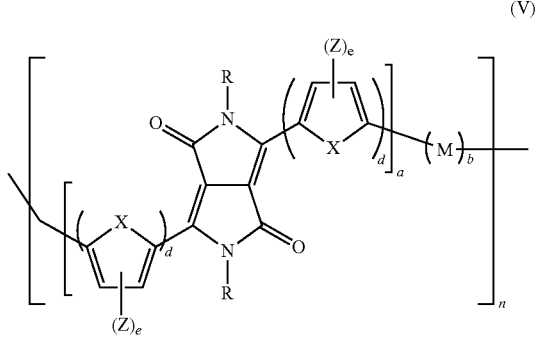

(V)

Where each X is independently a heteroatom, for example, S, Se, O, or NR", and where each R is as previously defined and each R" is as defined for R in structures (I)-(IV) above. In particular, R or R" is hydrogen, an optionally substituted hydrocarbon such as alkyl or aryl, or a hetero-containing group such as heteroaryl;

each Z is independently an optionally substituted hydrocarbon such as alkyl or aryl, a hetero-containing group such as CN, heteroaryl, or a halogen such as Br, Cl, or F;

d represents a number which is at least 1, e.g., from 1 to about 10;

e represents the number of Z, and can be from zero to 2;

R, M, a, b, and n may be as previously defined for structures (II)-(IV). In general, the values of d, q, and b may be the same or approximately the same for each repeat unit so that the copolymer has a regular structure. Where Z is an optionally substituted hydrocarbon or heteroaryl it can be as previously defined for R.

In one embodiment, e is zero and the structure V can be represented by structure VI:

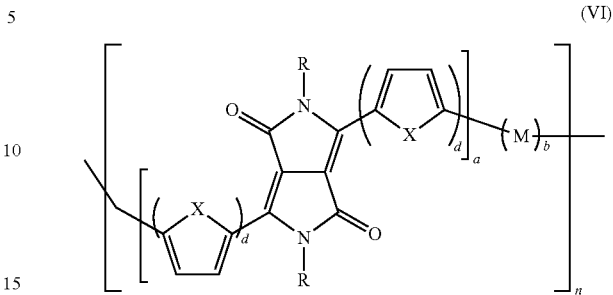

(VI)

In the embodiments shown in structures (V) and (VI), each Ar group, represented by:

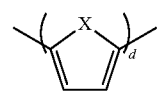

includes at least one heterocycle such as thiophene, furan, or pyrrole.

In one specific embodiment, where b is 0, the layer includes a compound which includes a structure (VII):

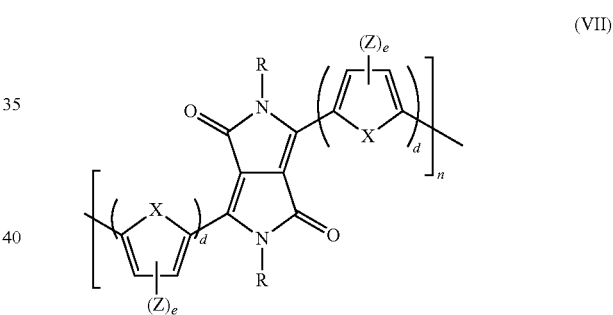

(VII)

where X, R, Z, d, e, and n are as defined for structure (V) above. In one embodiment n is from 2 to 5000. In one specific embodiment, n is from 10-50. In another specific embodiment, R is an alkyl group having from 1 to 50 carbon atoms.

In one embodiment, e is zero and the structure is represented by structure (VIII):

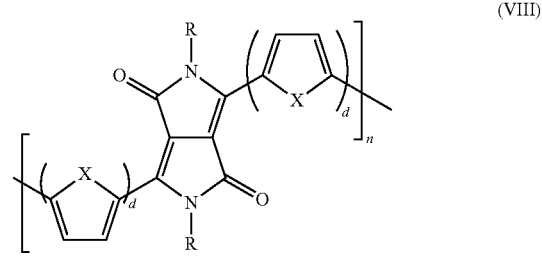

(VIII)

Exemplary compounds according to formula (VIII) for forming a semiconducting layer include those which include one or more of a (2,5-dialkyl-3,6-bis(thienyl/furyl/pyrrolyl-5-yl)-diketopyrrolopyrrole), a poly(2,5-dialkyl-3,6-bis(thienyl/furyl/pyrrolyl-5-yl)-diketopyrrolopyrrole), a (2,5-diaryl-3,6-bis(thienyl/furyl/pyrrolyl-5-yl)-diketopyrrolopyrrole), a poly(2,5-diaryl-3,6-bis(thienyl/furyl/pyrrolyl-5-yl)-diketopyrrolopyrrole), a (3,6-bis(thienyl/furyl/pyrrolyl-5-yl)-diketopyrrolopyrrole), a poly(3,6-bis(thienyl/furyl/pyrrolyl-5-yl)-diketopyrrolopyrrole), and combinations thereof.

In various embodiments, d has the same or approximately the same value for each repeat unit, so that the backbone is a regular polymer.

Exemplary semiconducting compounds in accordance with the exemplary embodiment include:

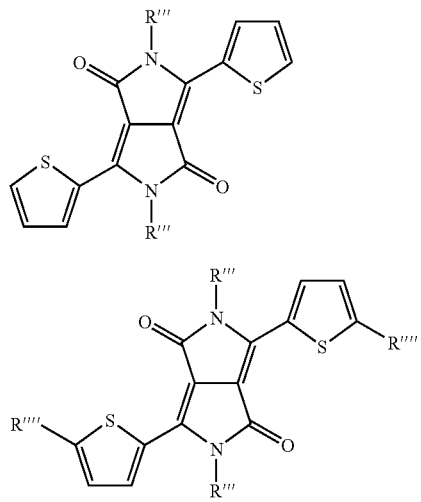

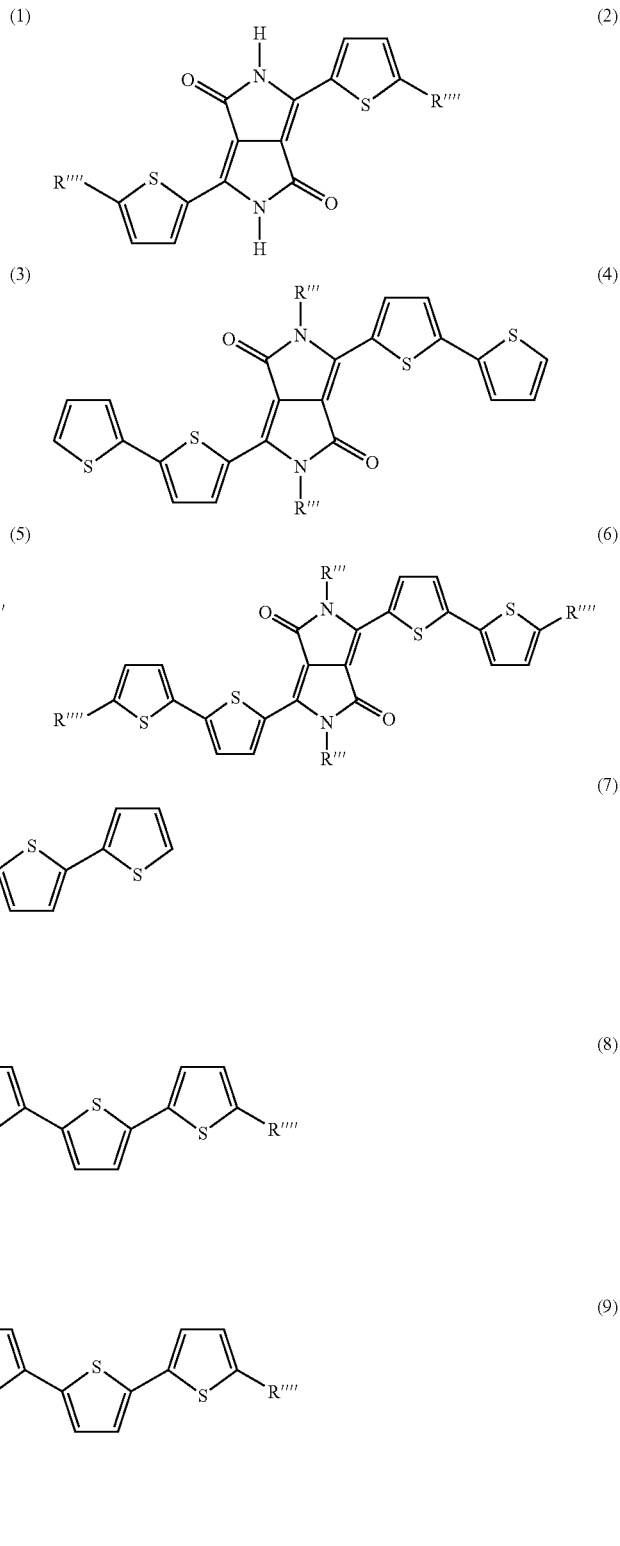

-continued
(10)
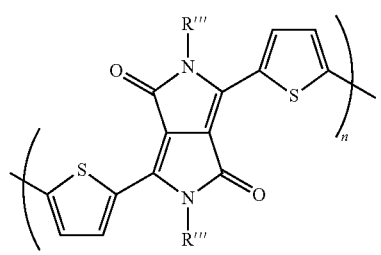
(11)
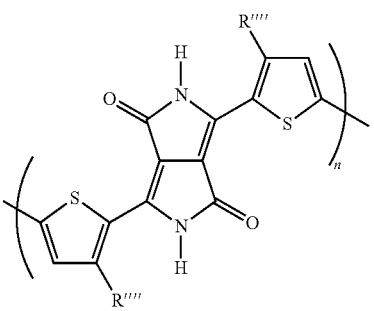
(12)
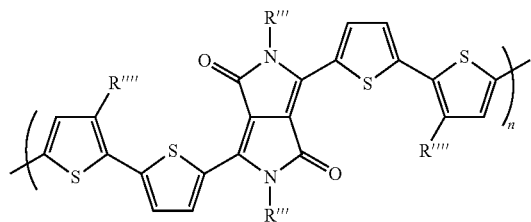
(13)
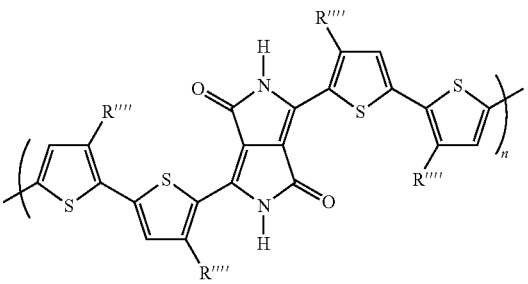
(14)
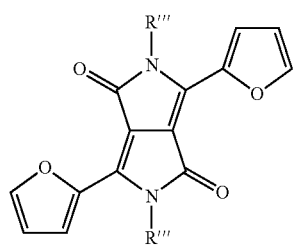
(15)
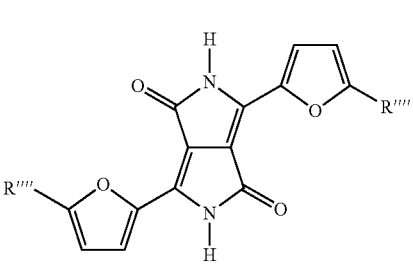
(16)
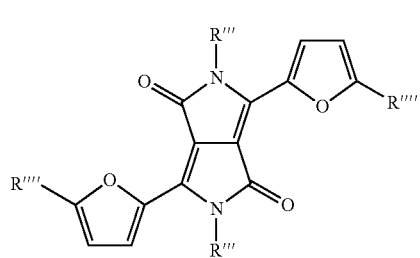
(17)
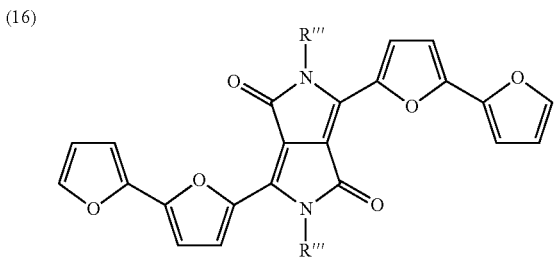
(18)
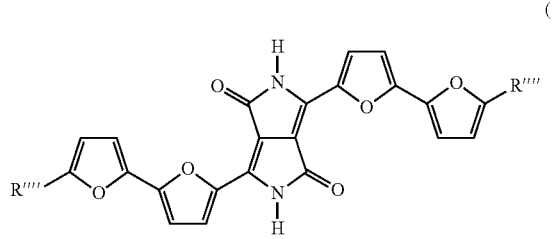
(19)
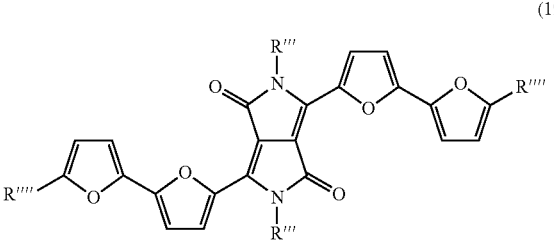
(20)
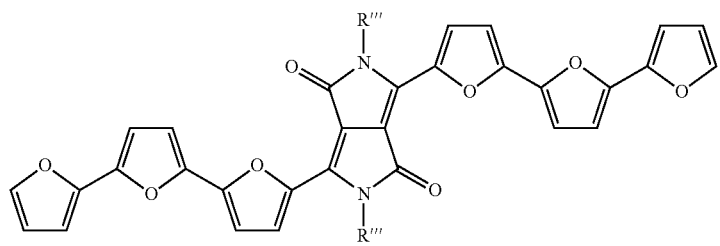

-continued
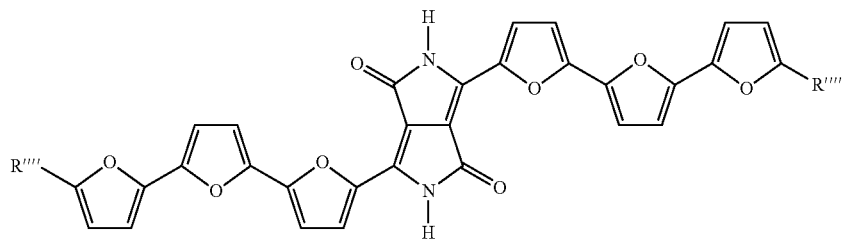
(21)
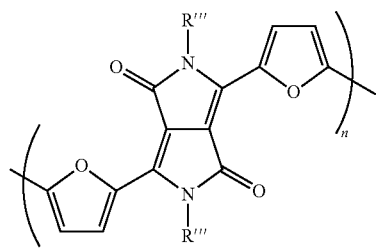
(22)
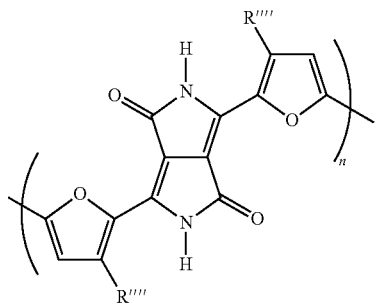
(23)
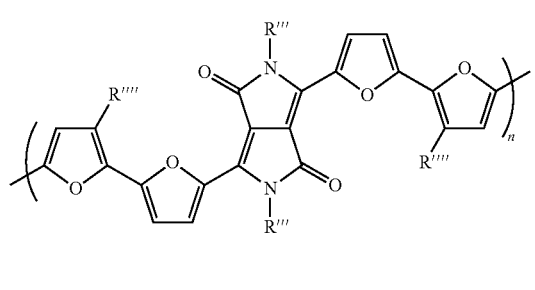
(24)
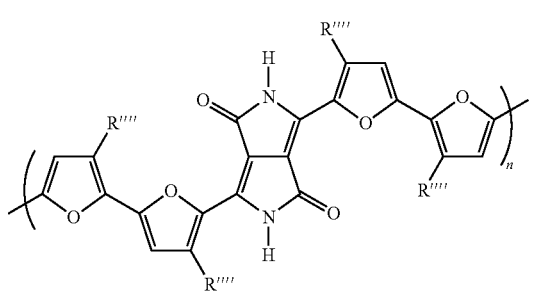
(25)
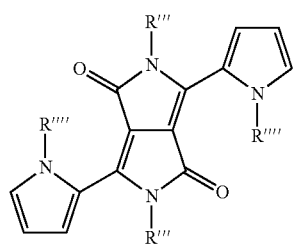
(26)
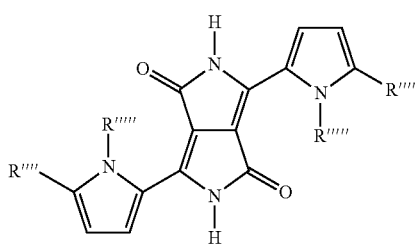
(27)
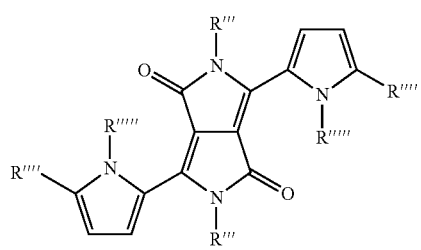
(28)
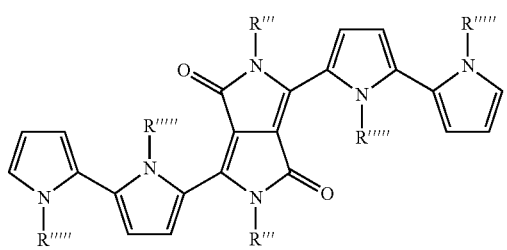
(29)
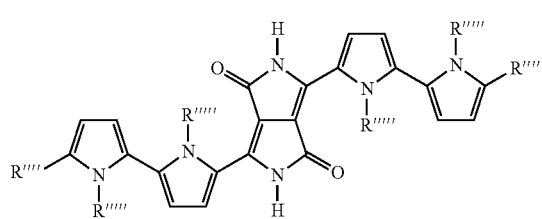
(30)
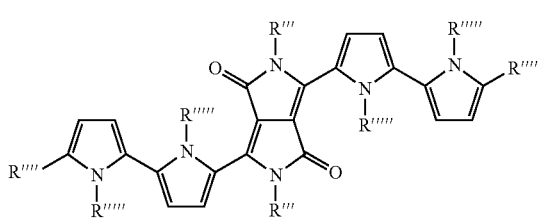
(31)

-continued
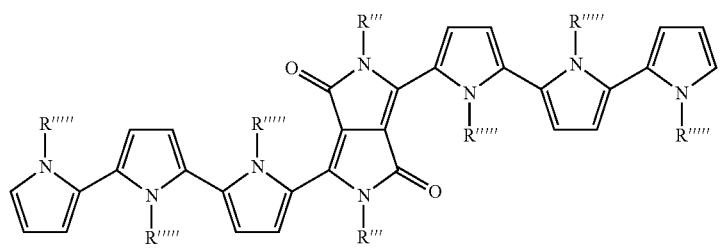
(32)
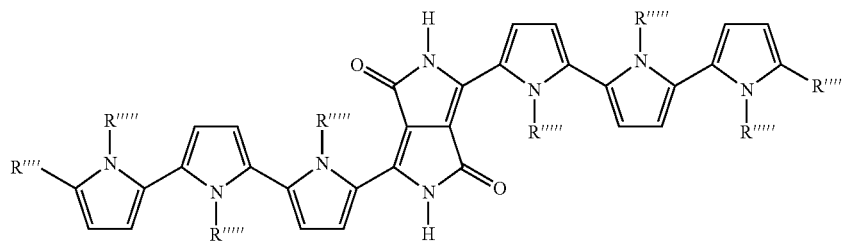
(33)
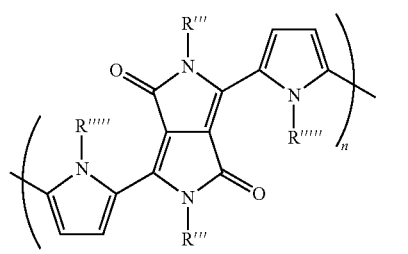
(34)
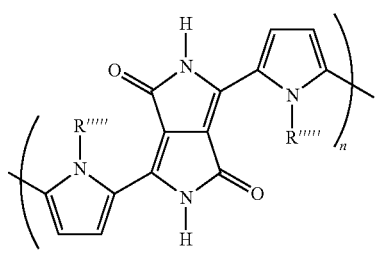
(35)
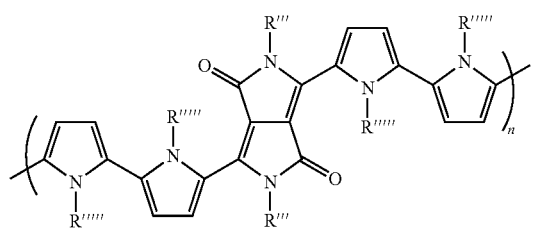
(36)
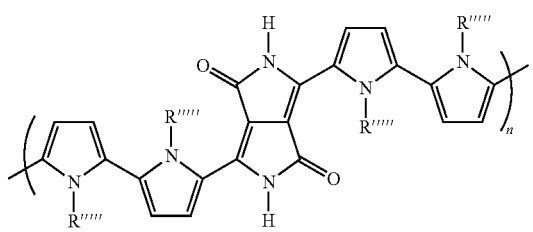
(37)
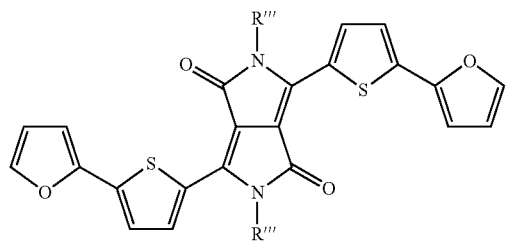
(38)
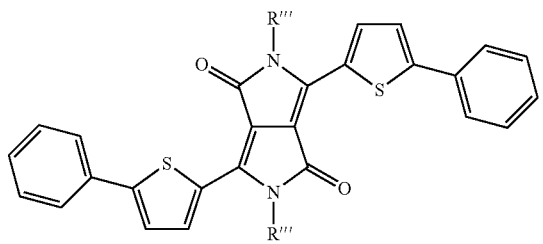
(39)
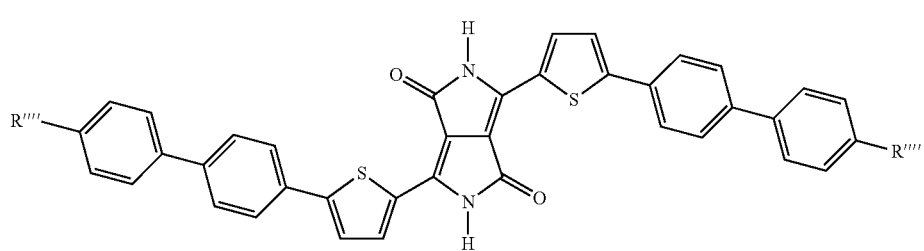
(40)

-continued
(41)
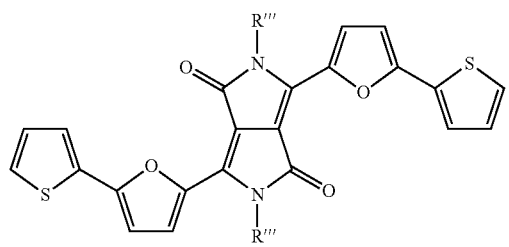
(42)
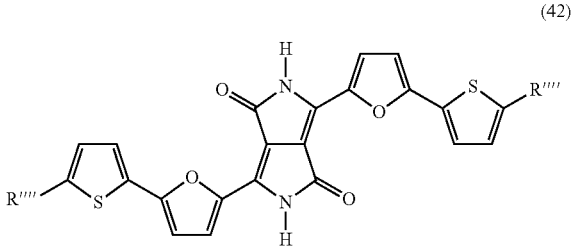
(43)
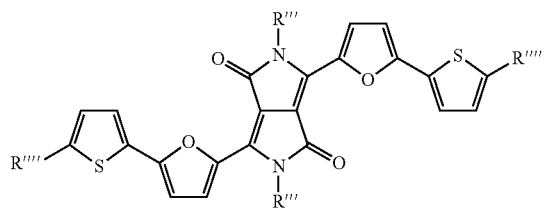
(44)
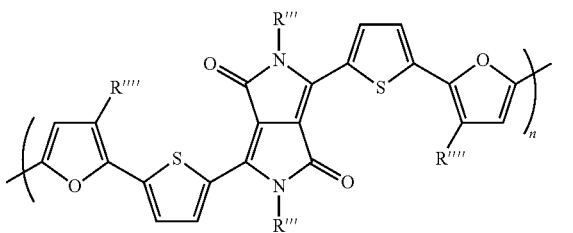
(45)
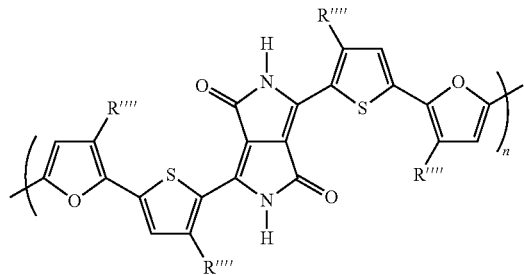
(46)
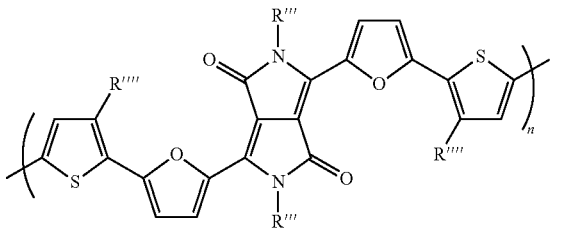
(47)
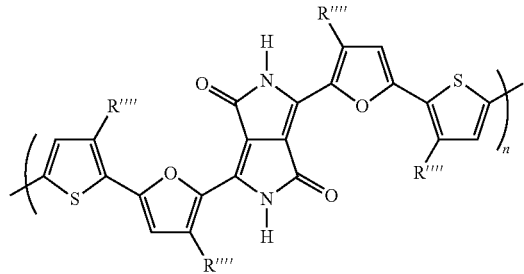
(48)
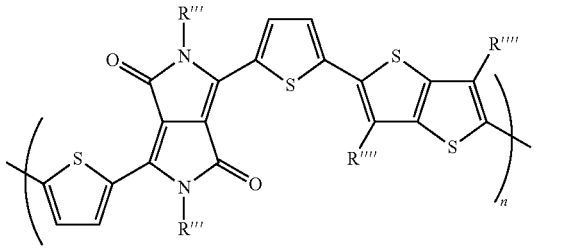
(49)
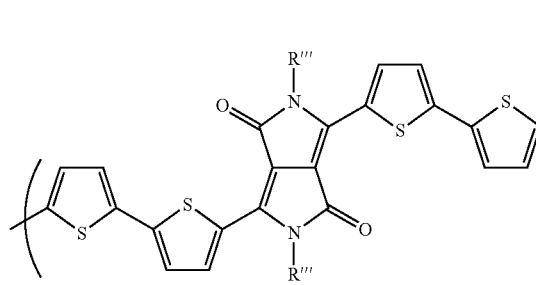
(50)
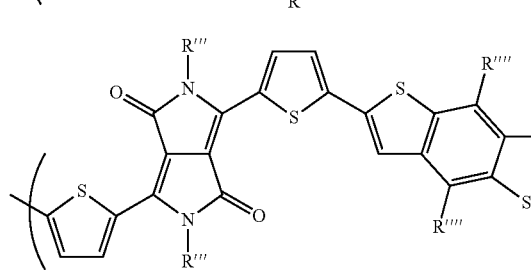

-continued
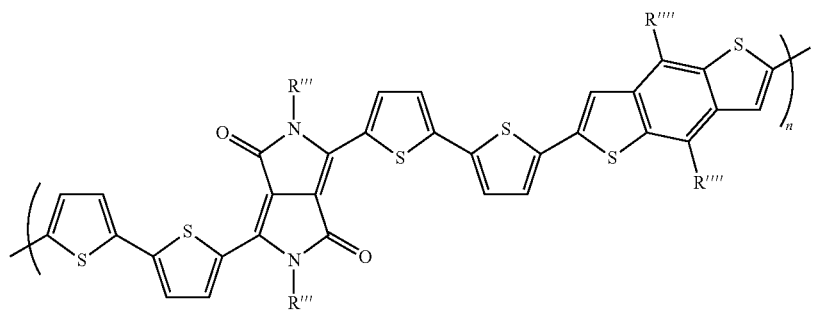
(51)
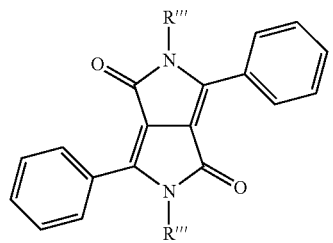
(52)
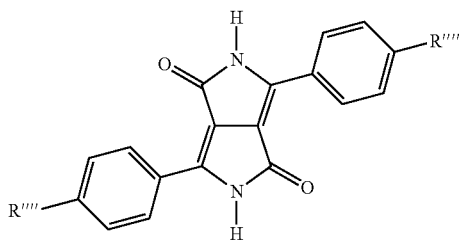
(53)
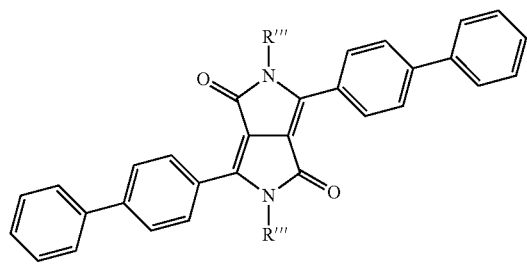
(54)
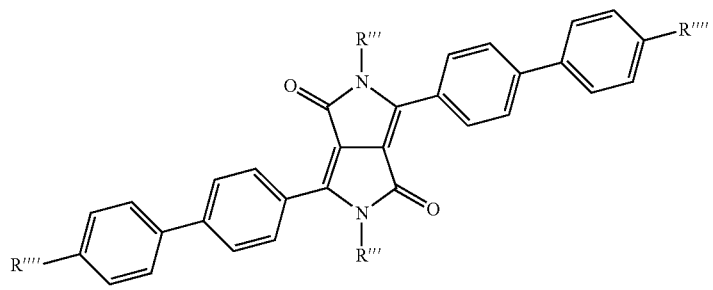
(55)
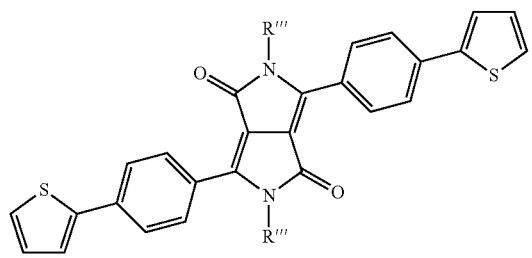
(56)
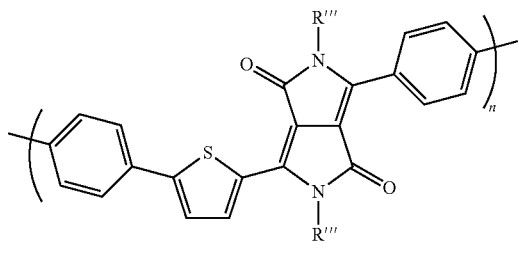
(57)

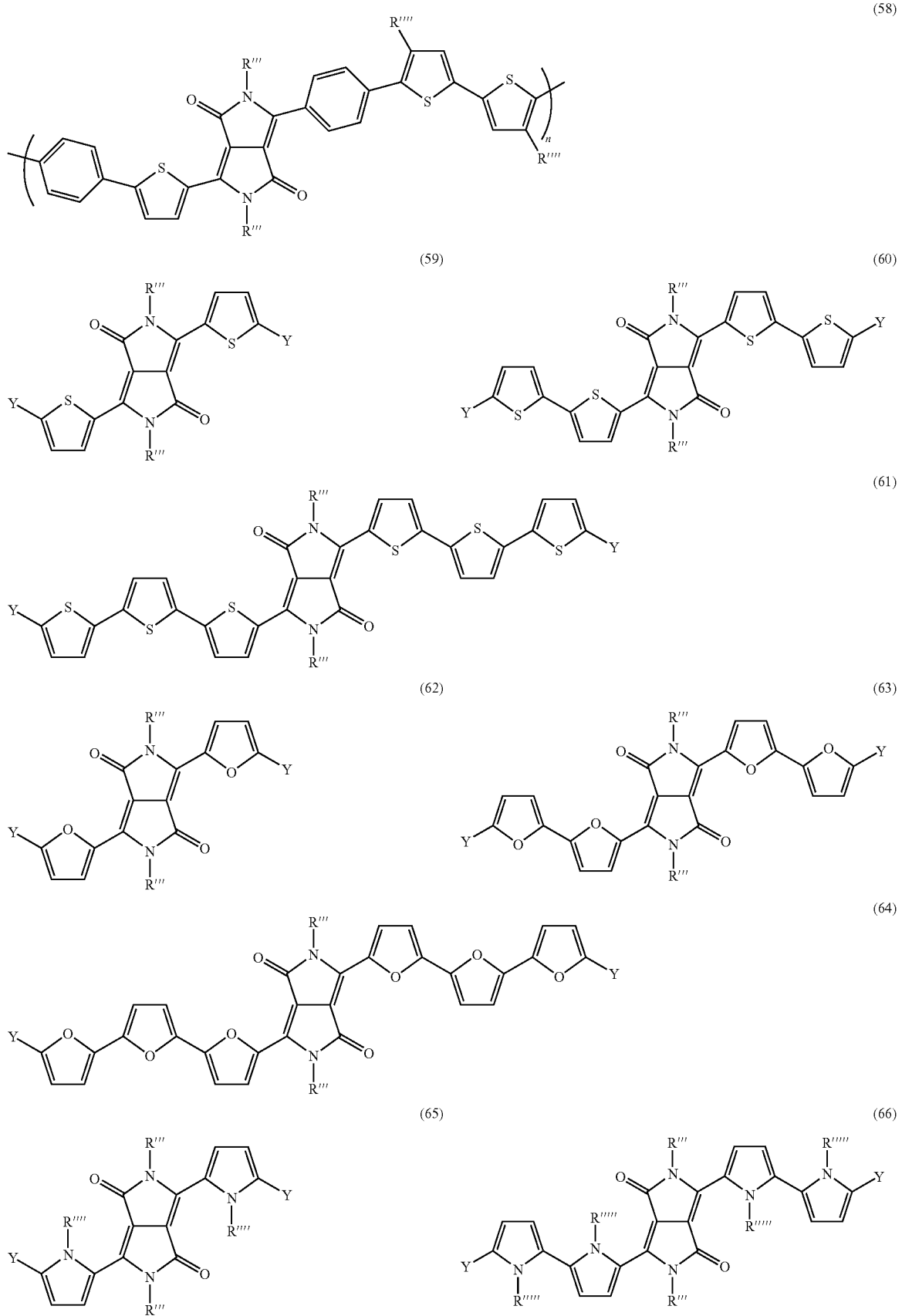

-continued

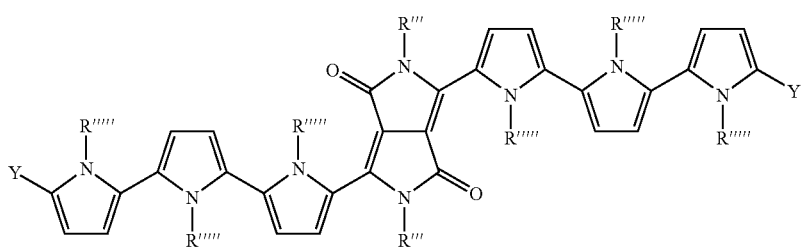

(67)

and mixtures thereof, wherein n is the number of repeat units and can be from about 2 to about 5000, R''', R'''', and R''''' can be the same or different substituent, and wherein the substituent is independently selected from the group consisting of an optionally substituted hydrocarbon group and a heteroatom-containing group, and Y is a halogen atom selected from F, Cl, and Br.

Of the exemplary structures listed above, structures (1), (4), (7), (10), (12), (14), (22), (26), and (34) may be particularly useful in a semiconductor layer for a thin film conductor.

As an example of a polymer formed according to structure (VII), a polymer based on poly(2,5-dialkyl-3,6-bis(thienyl-5-yl)-diketopyrrolopyrrole) may be used, for example, in a semiconductor layer. Such a polymer may thus have the general formula:

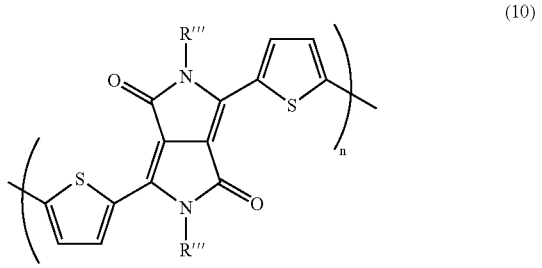

(10)

wherein n is a number of repeat units and can be from 2 to about 5000 and each R''' is an alkyl, independently selected from the group consisting of butyl, pentyl, hexyl, heptyl, octyl, nonyl, decyl, undecyl, dodecyl, tridecyl, tetradecyl, pentadecyl, hexadecyl, heptadecyl, octadecyl, nonadecynyl, and eicosanyl. An example is poly(2,5-dioctadecyl-3,6-bis (thienyl-5-yl)-diketopyrrolopyrrole).

While not being bound by any particular theory, the electron-withdrawing nature of the diketone and the high coplanarity of this structure give these polymers high field-effect mobility and excellent air-stability when the polymers are used as p-channel semiconductors in OTFTs. The five-membered heterocycles, such as thiophene, furan, and pyrrole, in the polymers are electron-rich and thus facilitate hole injection and transport in the TFT devices. In addition, the less steric effect of the five-membered heterocycles minimizes the twisting of the polymer backbone, leading to high coplanarity of the backbone, a feature for achieving high mobility.

In the case of layer 22, the layer may comprise a small molecule, oligomer, or polymer based on any of structures (II) to (VIII), or combination thereof. In the case of a polymer, the polymer may include one or more types of repeat units of which the structure (II) to (VIII) serves as at least one repeat unit. The layer 22 may be formed exclusively of the small molecule, oligomer, or polymer(s) or may comprise additional compounds, such as binders, solvents, dopants, and the like. In one embodiment, the layer comprises at least 1 volume percent of the compound according to any of the structures disclosed herein. In another embodiment, the layer comprises at least 10 volume percent or at least 50 volume percent of the compound and can comprise up to 100% of the compound.

The exemplary compound may be dispersed in the binder for assisting the deposition of the layer 22 during formation of a semiconductor device and/or the binder may serve as a matrix for retaining the compound in the layer 22. For example, a layer may be formed which includes polystyrene as a binder in addition to one or more of the exemplary compounds. The binder may comprise from 0.1-99 vol. % of the layer 22, e.g., less than 50 vol. % of layer 22.

Figure 2:
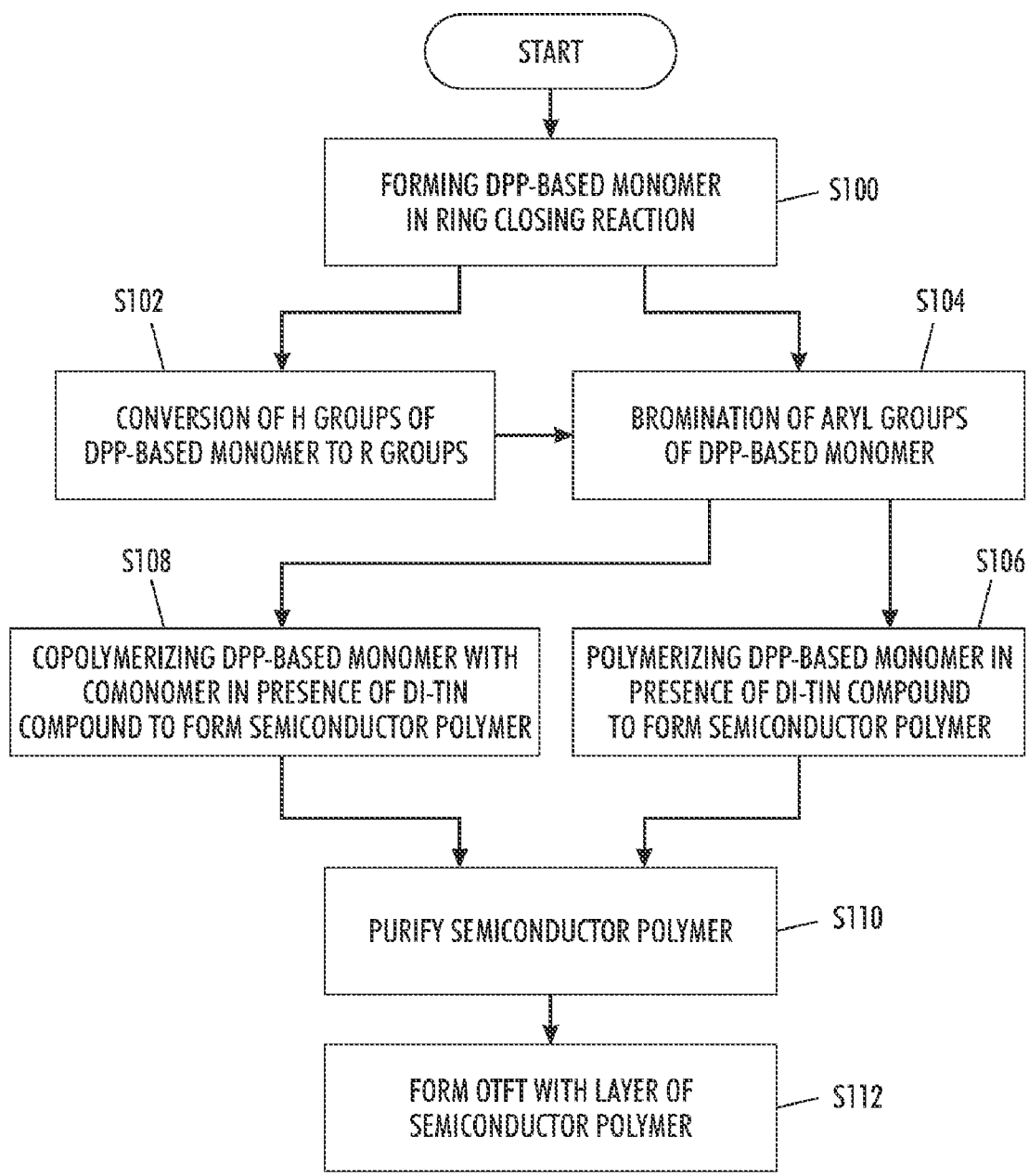
FIG. 2 illustrates an exemplary method of forming a polymer layer in accordance with the exemplary embodiment.

The polymer of structures (V) (VI), (VII), and (VIII) may be prepared by a four step process, as illustrated in FIG. 2.

At step S100, a DPP moiety may be formed by reacting 2 moles of an appropriate nitrile or a Schiff base with one mole of a succinic acid diester in the presence of a base and an organic solvent. For example, a carbonitrile (Ar—CN) for forming the selected Ar group (e.g., thiophenecarbonitrile) is reacted with diisopropyl succinate under suitable conditions for ring closure of the DPP moiety to form a monomer M1 of the general formula:

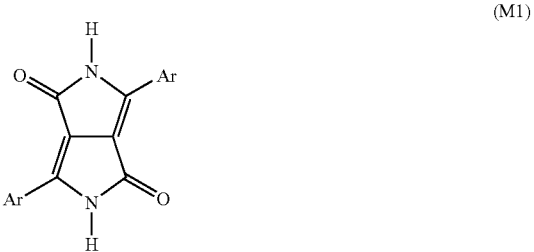

(M1)

Where Ar can be as defined above, and in particular, is

where X and b are as defined above.

For example, step S100 may be carried out in solution in the presence of a sodium alkoxide, such as t-$C_5H_{11}$ONa, which may be formed in situ, followed by neutralization with an organic acid, such as glacial acetic acid. The reaction may be performed at a suitable reaction temperature, such as about 85° C. U.S. Pat. No. 4,579,949 provides further details of reactions for forming DPP molecules.

At step S102, the H groups on the monomer (M1) obtained at step S100 may optionally be converted from H to a selected R group by reaction of the monomer with a halide of the formula R—Y, where R is as defined above (other than H) and Y is a halogen which may be selected from chlorine, bromine, and iodine. A monomer of the following structure (M2) is thus formed:

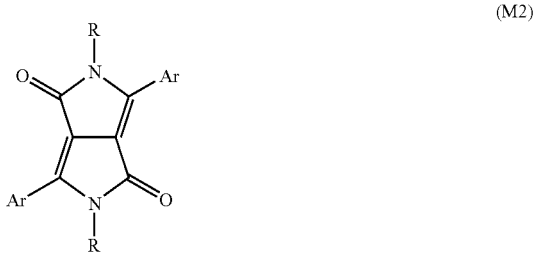

(M2)

Step S102 may be performed in solution at a suitable reaction temperature, such as about 40 to 180° C. (e.g., about 120° C.). The reaction may be carried out in a suitable solvent, such as dimethylformamide, in the presence of an aqueous base, such as an alkali metal hydroxide or carbonate and a crown ether, such as 18-crown-6. Suitable aqueous bases include NaOH, KOH, $Na_2CO_3$, $K_2CO_3$ and the like, e.g., an aqueous $K_2CO_3$ solution. Usually, the molar ratio of the base to compound M1 is chosen in the range of from 0.5:1 to 50:1.

At step S104, the Ar groups are halogenated, for example, by reaction of the monomer (M1) or (M2) formed in step S100 or S102 with a halogen, such as bromine, chlorine, or iodine, to form a monomer of the general formula:

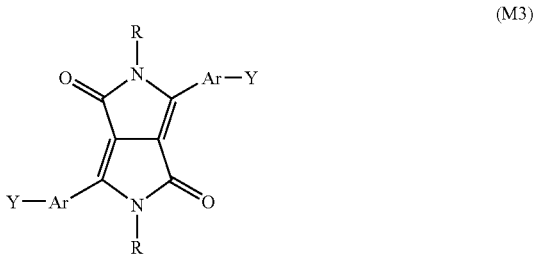

(M3)

Y can be a halogen, such as bromine, chlorine, or iodine. Step S104 may be carried out in any suitable non-reactive medium, such as chloroform, e.g., at room temperature or above.

At step S106, the monomer (M3) is polymerized to form a homopolymer of the general structure (III) above. In particular, when Ar is

the resulting polymer has the structure (VIII) above.

Alternatively, at S108, the monomer (M3) may be copolymerized with a comonomer for forming units M of structure (IV) (V), or (VI), as defined above. Suitable comonomers for providing the M unit include thiophene, furan, pyrrole, thieno[3,2-b]thiophene, benzo[1,2-b:4,5-b']dithiophene, and combinations thereof.

Step S106 or S108 may be performed in solution in the presence of a ditin compound, such as an hexaalkylditin or hexaarylditin compound such as hexamethylditin, hexa-n-butylditin, or hexaphenylditin, and a catalyst suitable for coupling reactions or for polycondensation reactions, optionally in the presence of copper(I) iodide. A suitable coupling catalyst is a palladium-based catalyst, e.g., a tetrakis(triarylphosphonium)-palladium catalyst, such as tetrakis(triphenylphosphine)palladium(0) ($Pd(PPh_3)_4$), or derivatives thereof. Usually, the catalyst is added in a molar ratio of DPP monomer to the catalyst in the range of from about 1000:1 to about 10:1, e.g., from about 100:1 to about 30:1. A suitable solvent for the reaction may be a mixture of THF and 1-methyl-2-pyrrolidinone (NMP). The reaction may be carried out under reflux at a temperature which is at or slightly above the boiling point of the solvent.

At S110, the resulting polymer may be purified, e.g., by Soxhlet extraction.

The polymers/copolymers thus formed may have a weight average molecular weight $M_w$ in the range of from 700 to 1,000,000, e.g., at least about 5000.

At S112, a layer comprising the polymer may be incorporated into a semiconductor device.

To form an OTFT of the type shown in FIG. 1, the resulting polymer (III), (IV), (V), (VI), (VII), or (VIII) may be dissolved in a suitable solvent, such as dichlorobenzene, and the solution deposited on a dielectric layer, for example, by spin coating, casting, vacuum deposition, or the like. The dielectric layer may be a silicon oxide layer which has been grown on a doped silicon wafer. The deposition of the semiconductor polymer may be performed under ambient conditions, e.g., in air or other atmosphere in which oxygen may be present in significant amounts, e.g., in an atmosphere where oxygen is above about 5% by weight, and at a temperature of about 25° C. The deposition may also be performed without excluding moisture in the atmosphere. For example, the deposition may be performed at a relative humidity of about 10%, or higher.

To aid the charge transport of the semiconductor polymer layer, a thin layer (e.g., less than 5 nanometers thick, such as a monolayer) of an organosilane, may be provided on the dielectric layer by modifying the dielectric layer with a reactive organosilane, such as octyltrichlorosilane, prior to deposition of the semiconductor polymer layer.

The resulting semiconductor layer may be then dried, for example, in a vacuum oven at 80° C. for 5-10 hours. Subsequently, source and drain electrodes may be patterned on the semiconductor layer, e.g., by gold deposition on top of the semiconductor layer by vacuum deposition through a shadow mask.

The resulting semiconductor device may be annealed at a suitable temperature, such as about 140° C. for 10-15 min, without risking damage to the semiconductor polymer.

Without intending to limit the scope of the exemplary embodiment, the following Examples provide a reaction scheme for forming one exemplary polymer according to structure (VII) and an OTFT formed therefrom.

Example 1

Synthesis of Poly(2,5-dioctadecyl-3,6-bis(thienyl-5-yl)-diketopyrrolopyrrole The synthesis of a representative polymer 4 is outlined in Scheme 1

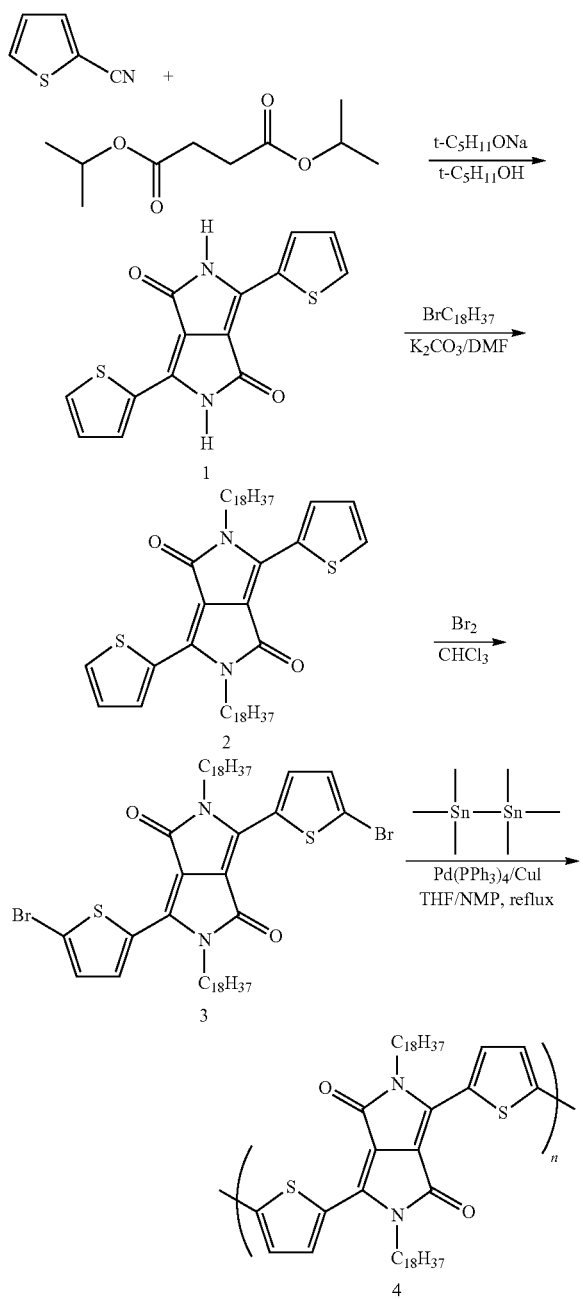

Scheme 1. Synthesis of polymer 4.

The experimental details are described as follows.

1. Synthesis of 3,6-Bis-(thienyl)-diketopyrrolopyrrole (1)

Sodium (3.45 g, 0.15 mol) was added to 60 mL of t-amyl alcohol and a small amount of iron(III) chloride (50 mg) was added. The mixture was stirred vigorously for 1 hr at 95-102° C. until sodium disappeared. The solution was cooled to 85° C. To the resultant solution was added 10.9 g (0.1 mol) of 2-thiophenecarbonitrile. Then, 8.3 g (0.04 mol) of diisopropyl succinate in 5 mL of t-amyl alcohol was added drop-wise over 1 h at 85° C. When addition was complete, the mixture was maintained for 2 hr at this temperature. The reaction mixture was then cooled to 50° C., diluted with 50 mL of methanol, and then slowly neutralized with ~15 mL of glacial acetic acid and refluxed briefly, and the reaction mixture was filtered. After the residue was washed several times with hot methanol and water, the resultant solid was dried in vacuo at 50° C. A bluish-red solid (11 g, yield 92%) was obtained (compound (1)). The solid was analyzed with NMR, with the results being as follows: $^1$H NMR (DMSO-D$_6$): 11.23 (s, 2H), 8.20 (d, J=3.7 Hz, 2H), 7.95 (d, J=4.9 Hz, 2H), 7.29 (dd, J$_1$=3.7 Hz, J$_2$=4.9 Hz, 2H).

2. 2,5-Dioctadecyl-3,6-bis-(thienyl)-diketopyrrolopyrrole (2)

A mixture of compound (1) (1.5 g, 5 mmol), 2.31 g (16.7 mmol) of K$_2$CO$_3$, and 12 mg of 18-crown-6, and 1-bromooctadecane (5.57 g, 16.7 mmol) in 75 mL of dimethylformamide (DMF) was heated at 120° C. over night. After being cooled to room temperature, the solution was filtered, and the solid was washed with water several times. The solid was dissolved in chloroform by heating and filtered. The filtrate was cooled to room temperature and red precipitates formed. The solid was filtered and dried in vacuo (compound (2)). Yield: 3.01 g (74.7%). $^1$H NMR (CDCl$_3$): 8.93 (dd, J$_1$=3.9 Hz, J$_2$=1.1 Hz, 2H), 7.64 (dd, J$_1$=5.0 Hz, J$_2$=1.1 Hz, 2H), 7.28 (dd, J$_1$=5.0 Hz, J$_2$=3.9 Hz, 2H), 4.07 (t, J=7.8 Hz, 4H), 1.74 (m, 4H), 1.20-1.50 (m, 60H), 0.88 (t, J=6.6 Hz, 6H). Melting point: 124° C.

3. 2,5-Dioctadecyl-3,6-bis-(5-bromothienyl)-diketopyrrolopyrrole) (3)

Compound (2) (4.416 g, 3 mmol) and 30 mL of chloroform were added to a 100 mL three-necked flask equipped with a stirring bar, a condenser, and an addition funnel. Then, 0.96 g (6 mmol) of Br$_2$ in 20 mL of chloroform was added to the flask at room temperature. The mixture was stirred at room temperature for 10 min and then warmed to 60° C. and stirred for an additional hour. The reaction mixture was then cooled to room temperature and filtered. The red solid was washed with Na$_2$SO$_3$ solution, water and finally washed with methanol extensively. The solid was then dissolved in chloroform by heating and then cooled down to room temperature. After filtration, a dark purple solid was obtained, which was dried in vacuo. Yield: 1.78 g (61.6%). $^1$H NMR (CDCl$_3$): 8.69 (d, J=4.2 Hz, 2H), 7.24 (d, J=4.2 Hz, 2H), 3.98 (t, J=7.7 Hz, 4H), 1.71 (m, 4H), 1.20-1.50 (m, 60H), 0.88 (t, J=6.6 Hz, 6H). Melting point: 161° C.

4. Poly(2,5-dioctadecyl-3,6-bis(thienyl-5-yl)-diketopyrrolopyrrole) (4)

To a 100 mL flask were added hexamethylditin (0.344 g, 1.05 mmol), tetrakis(triphenylphosphine)palladium(0), Pd(PPh$_3$)$_4$ (58 mg, 0.05 mmol), copper(I) iodide (3.8 mg, 0.02 mmol), compound (3) (0.9631 g, 1 mmol), THF (30 mL), and 1-methyl-2-pyrrolidinone (NMP) (15 mL). The reaction mixture was heated to reflux for 48 hr and then cooled down to room temperature and poured into 200 mL of stirring acetone. The solid was filtered off, washed with methanol, and dried. The solid was then further purified by Soxhlet extraction using heptane for 48 hr, and then dissolved with chlorobenzene. Upon removal of solvent, a dark blue solid was obtained (0.50 g, 62.5%) (compound (4)).

Example 2

OTFT Fabrication and Characterization

A top-contact thin film transistor configuration as schematically illustrated in FIG. 1 was selected as a test device structure. The test device was built on an n-doped silicon wafer with a thermally grown silicon oxide layer 20 with a thickness of about 200 nanometers thereon, and had a capacitance of about 15 nF/cm$^2$ (nanofarads/square centimeter), as measured with a capacitor meter. The wafer functioned as the gate electrode while the silicon oxide layer acted as the gate dielectric.

The n-doped silicon wafer with silicon oxide layer thereon was first cleaned with isopropanol, argon plasma, isopropanol and air dried, and then immersed in a 0.1 M solution of octyltrichlorosilane (OTS-8) in toluene at 60° C. for 20 min. Subsequently, the wafer was washed with toluene, isopropanol and air-dried. A solution of polymer (4) (poly(2,5-dioctadecyl-3,6-bis(thienyl-5-yl)-diketopyrrolopyrrole)) dissolved in dichlorobenzene (0.5 percent by weight) was first filtered through a 1.0 micrometer syringe filter, and then spin-coated on the OTS-8-treated silicon wafer at 1000 rpm for 120 seconds at room temperature. This resulted in the formation of a semiconductor layer with a thickness of 20-50 nanometers on the silicon wafer, which was then dried in a vacuum oven at 80° C. for 5-10 hr. Subsequently, gold source and drain electrodes of about 50 nanometers in thickness were deposited on top of the semiconductor layer by vacuum deposition through a shadow mask with various channel lengths and widths, thus creating a series of transistors of various dimensions. The devices were annealed at 140° C. for 10-15 min before evaluation.

The evaluation of transistor performance was accomplished in a black box (that is, a closed box which excluded ambient light) at ambient conditions using a Keithley 4200 SCS semiconductor characterization system. The carrier mobility, μ, was calculated from the data in the saturated regime (gate voltage, $V_G$<source-drain voltage, $V_{SD}$) according to equation (1)

$$I_{SD} = C_i \mu (W/2L)(V_G - V_T)^2 \tag{1}$$

where $I_{SD}$ is the drain current at the saturated regime, W and L are, respectively, the semiconductor channel width and length, $C_i$ is the capacitance per unit area of the gate dielectric layer 20, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}=0$.

The transfer and output characteristics of the devices showed that compound (4) was a p-type semiconductor. Using transistors with a dimension of W=5,000 μm and L=90 μm, the following average properties from at least five transistors were obtained:
Mobility: 0.08-0.12 cm$^2$/V.s.
On/off ratio: 10$^6$.

The mobility and current on-to-off ratio are comparable to polythiophenes (e.g., poly(3-hexylthiophene) (P3HT) and poly[thiophene] (PQT)). The OTFT devices were fabricated and measured entirely under ambient conditions, indicating the excellent air-stability of this type of polymers.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A thin film transistor device comprising:
a semiconductor layer, the semiconductor layer comprising a compound comprising a chemical structure represented by:

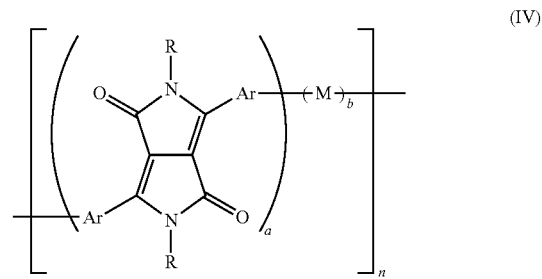

wherein each R is independently selected from hydrogen, an optionally substituted hydrocarbon, and a hetero-containing group;

each Ar is independently selected from optionally substituted heteroaryl groups;

each M is a conjugated moiety selected from:

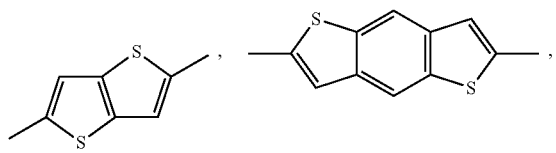

and substituted derivatives and combinations thereof;

a represents a number that is at least 1;

b represents a number from 1 to 20; and n represents a number that is at least 1.

2. The thin film transistor device of claim 1, wherein each heteroaryl group Ar comprises a heteroatom selected from S, Se, O, and NR″, wherein each R″ is independently selected from hydrogen, an optionally substituted hydrocarbon, and a hetero-containing group.

3. The thin film transistor device of claim 2, wherein each heteroaryl group Ar comprises a thiophene ring.

4. The thin film transistor device of claim 1, wherein the compound is selected from the group consisting of:
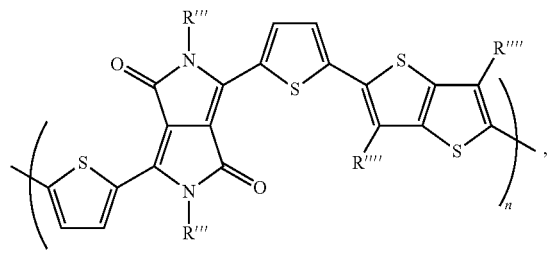
(48)
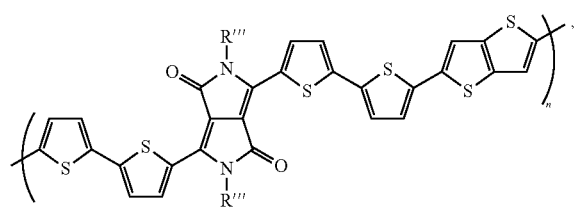
(49)
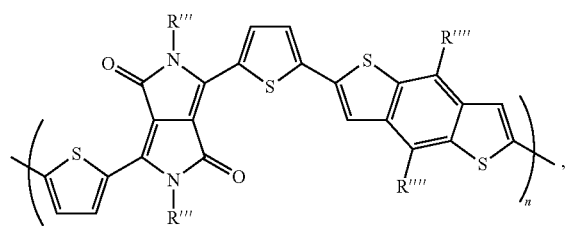
(50)
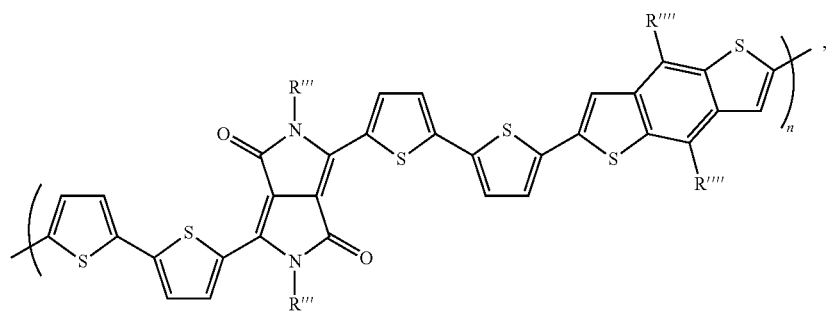
(51)

and mixtures thereof;

wherein n represents a number of repeat units from 2 to 5000; and

R''' and R'''' independently are the same or a different substituent, and wherein the substituent is independently selected from the group consisting of an optionally substituted hydrocarbon group and a heteroatom-containing group.

5. The thin film transistor device of claim 1, wherein the compound has the structure:

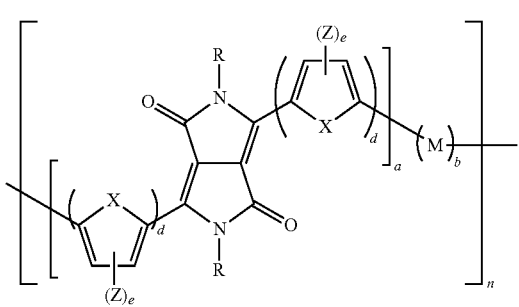

wherein each X is independently selected from S, Se, O, and NR", each R" is independently selected from hydrogen, an optionally substituted hydrocarbon, and a hetero-containing group, each Z is independently one of an optionally substituted hydrocarbon, a hetero-containing group, and a halogen, d is a number which is at least 1, and e is a number from zero to 2.

6. The thin film transistor device of claim 1, wherein each R is an alkyl, independently selected from the group consisting of butyl, pentyl, hexyl, heptyl, octyl, nonyl, decyl, undecyl, dodecyl, tridecyl, tetradecyl, pentadecyl, hexadecyl, heptadecyl, octadecyl, nonadecynyl, and eicosanyl.

7. The thin film transistor device of claim 1, wherein each R is octadecyl.

* * * * *